(12) United States Patent  
Harbison et al.

(10) Patent No.: US 7,162,765 B2  
(45) Date of Patent: Jan. 16, 2007

(54) SEAL SYSTEM FOR IRRIGATED SCRUBBER MANDREL ASSEMBLY

(75) Inventors: Adam Sean Harbison, Los Gatos, CA (US); Scott Peterson, Scotts Valley, CA (US); Bryan Riley, San Jose, CA (US)

(73) Assignee: Xyratex Technology Ltd., Havant Hampshire (GB)

( * ) Notice: Subject to any disclaimer, the term of this patent is extended or adjusted under 35 U.S.C. 154(b) by 607 days.

(21) Appl. No.: 10/625,973

(22) Filed: Jul. 23, 2003

(65) Prior Publication Data

US 2005/0015903 A1    Jan. 27, 2005

Related U.S. Application Data

(63) Continuation-in-part of application No. 09/580,827, filed on May 26, 2000, now Pat. No. 6,625,835.

(60) Provisional application No. 60/154,970, filed on Sep. 20, 1999, provisional application No. 60/136,635, filed on May 27, 1999.

(51) Int. Cl.  
*B08B 1/04* (2006.01)

(52) U.S. Cl. .......................................... 15/77; 15/88.3

(58) Field of Classification Search ................. 15/21.1, 15/77, 88.3, 97.1, 102; 137/580; 285/272  
See application file for complete search history.

(56) References Cited

U.S. PATENT DOCUMENTS

| | | | |
|---|---|---|---|
| 5,439,029 A | * | 8/1995 | Becker ........................ 137/580 |
| 6,625,835 B1 | | 9/2003 | Frost et al. |

* cited by examiner

*Primary Examiner*—Mark Spisich  
(74) *Attorney, Agent, or Firm*—Innovation Law Group, Ltd.; Jacques M. Dulin, Esq.

(57) ABSTRACT

An improved cleaning fluid supply housing assembly for a cascade-type substrate scrubber having a sliding piston configured with a flange with recesses so that the piston is out of contact with the rotating part of the brush core mandrel bearing assembly. Rather, the piston flange outer face only contacts the stationary outer race of the mandrel bearing. The water supply piston is also configured with a full bore to minimize the pressure on the end of the mandrel. A tolerance-controlled leak through the bearing is provided by the configuration of the piston flange to provide a flushing of the area in which wear might be a source of particle generation by a controlled tolerance leak upstream of the brushes. These features substantially eliminate the source of particle generation from contact wear and the contribution of such wear particles into the interface between the brush and the substrate surface being cleaned.

8 Claims, 4 Drawing Sheets

SEAL SYSTEM FOR IRRIGATED SCRUBBER MANDREL ASSEMBLY

CROSS REFERENCE TO RELATED APPLICATIONS

This application is a continuation-in-part of U.S. application Ser. No. 09/580,827 filed May 26, 2000, now U.S. Pat. No. 6,625,835, which in turn claims benefit of U.S. Provisional Applications 60/136,635 filed May 27, 1999 and 60/154,970 filed Sep. 20, 1999.

FIELD

This invention is directed to substrate preparation systems and methods, and more particularly to apparatus and methods for cleaning of disk-shaped substrates, including silicon wafers of the type used in the fabrication of computer chips, and aluminum, ceramic, plastic, glass and multi-component disks for data storage devices such as hard disk drives (HDD), compact discs (CD), digital video discs (DVD), and the like, used in the computer, information and entertainment industries.

BACKGROUND

The computer, information, and entertainment industries produce and consume annually hundreds of millions of disk-shaped substrates, principally silicon wafers, and aluminum, plastic, glass, or other multi-component disks. In the fabrication of computer CPU chips, silicon wafers are processed through multiple fabrication steps which include repeated application and selective removal of variously conductive, non-conductive and semi-conductive materials before the resulting micro-circuits are complete and separated into individual dies. Aluminum, glass, and other composite disk substrates are typically over-coated with magnetic, optical, or magneto-optical materials in the fabrication of HDDs, CDs, DVDs, and other data storage products.

Substrates must be buffed, polished, etched, cleaned, and otherwise prepared repeatedly during the fabrication process. This is true for both wafer and disk substrates. In the semiconductor manufacturing industry, integrated circuit devices designed with complex, and extremely fine and precise multi-layered structures, require highly clean and prepared surfaces. In the field of magnetic and optical media disks, ever-increasing areal density translates into exacting requirements for disk cleaning and preparation. Defects resulting from improper, incomplete, or insufficient substrate buffing, polishing, cleaning, or other preparation produces decreased yield and increased time and cost.

By way of example, a microscopic contaminant of size on the order of 0.1 micron left on the surface of a hard drive disk substrate could cause the hard drive to fail, as the clearance between the drive head and the substrate magnetic media is only on the order of 0.0125 microns (0.5 microinches). Accordingly, the standard of cleanliness of hard drive substrates currently required in industry is no more than 1 particle per side no greater than 0.1 micron. More contaminants in size or number result in rejection of the substrate disk and a reduction in yield. This is extremely significant in this industry, as the cost to the consumer per megabyte of hard drive capacity, on the order of $40 per MB in 1985, is now on the order of <0.125 cents per MB, or <$1.25 per Gigabyte. With incredibly thin margins, it becomes essential that substrate cleaning systems, e.g., scrubber apparatus and methods, are fast, highly efficient and result in high yield of substrates that meet particulate cleanliness standards.

To meet the ever increasing demands for cleaner substrates, both semiconductor and disk industries adopted rotating brush scrubbing as the standard cleaning procedure. Each brush station includes one or more pair of brushes. The brush material is usually polyvinyl alcohol (PVA), but other materials such as mohair and nylon can be used. To keep the brushes clean and extend the brush life, it is common practice to deliver water or other cleaning fluid through a hollow brush core. The brush core has a one open end for cleaning fluid input. The cleaning fluid is delivered from the interior of the brush core to the interface of the PVA brush and substrate surface being cleaned through as series of fine holes or channels distributed along the longitudinal length of the brush and passing through the wall of the brush. The open end of the brush core is coupled with a supply housing that provides cleaning fluid under pressure that continuously passes through the holes and flushes the interface of the brush with the substrate surface being cleaned.

However, in present commercially available brush scrubber systems, the cleaning/rinsing fluid supply is connected to the hollow brushes via a double ring bearing. During the cleaning operation the water pressure pushes an axially slideable delivery piston or nozzle of the cleaning fluid supply housing against the rotating brush core in order to maintain a positive seal against the fluid pressure. The piston is slideable to permit removal of the brush. The resulting contact under pressure causes wear on both the contacting bodies (bearing and brush mandrel) resulting in microparticle debris generation. This wear-generated debris will migrate with cleaning fluid through the brush holes or channels to the substrate surface. The debris results in product failure and yield loss through, for example, scoring of the substrate surface or deposition on the surface. The result is that current brush scrubber systems are rapidly approaching efficiency limits, in that they can actually produce particulates rather than remove them.

Accordingly, there is a need in the art for a cleaning system that can keep up with the increasing requirements for substrate cleanliness, and more particularly a system that includes fluid delivery assemblies that reduce the potential for contribution of particulate debris during the cleaning process, and that is simple and inexpensive to manufacture and maintain.

THE INVENTION

Summary of the Invention, Including Objects and Advantages

The present invention provides a simple and economic solution to the particulates contribution problem in the art by a brush core water supply housing assembly in which a sliding piston inside the housing is configured with a flange having one or more recesses so that the piston is out of contact with the rotating part of the brush core mandrel bearing assembly. Rather, the piston has a specially configured flange that has an outer face that only contacts the stationary outer race of the mandrel bearing. The water supply piston is also configured with a full bore, that is, without a reduced bore forming a nozzle, thereby minimizing the hydraulic pressure of the input cleaning fluid so as to minimize the pressure on the end of the mandrel. In addition, a tolerance-controlled leak through the bearing is provided by the configuration of the outer, stepped face of the piston flange. This leak provides a flushing of the area in which wear might be a source of particle generation. Further, this controlled leak is upstream of the brush core apertures, originates adjacent the potential wear faces and exits external to the brush upstream of it. In combination, these features function to substantially eliminate both the source of particle generation from contact wear between brush core mandrel and cleaning/rinsing fluid supply housing, and the contribution of such wear particles into the interface between the brush and the substrate surface being cleaned.

A typical cleaning/rinsing fluid is water, or water supplemented with washing or rinsing agents such as detergents, surfactants and other chemical agents compatible with the requirements of the substrate materials. Broadly included are anionic, cationic, non-ionic, amphoteric detergents and surfactants, acidic and alkaline-based agents, alcohols and perfluorocarbon agents, and the like. By way of non-limiting example the flowing high purity aqueous detergent compositions for precision cleaning may be used: TCL 300 and Morclean DN 30 from Chemetall Oakite corporation, Berkely Heights, N.J., USA, and Valtron SP2200 from Valtech Corporation, Pottstown, Pa., USA. TCL 300 includes 1–10% monoethanolamine; 1–5% diprolylene glycol emethyl ether, a suractant and water; DN 30 includes 20–30% monoethanolamine, 1–5% KOH, 1–5% of diphosphoric acid tetrapotassium salt, a surfactant and water. SP 2200 is a blend of non-ionic and anionic surfactants, 4–5% 2-butoxyethanol, EDTA (ethylene diamine tetra-acetic acid) and water. These are merely exemplary, and it well within the skill of those in the art to select, without undue experimentation, washing and cleaning agents that are suitable for use in the inventive apparatus in accord with the inventive process disclosed herein.

BRIEF DESCRIPTION OF THE DRAWINGS

The invention is described in more detail with reference to the drawings, in which.

DETAILED DESCRIPTION, INCLUDING THE BEST MODES OF CARRYING OUT THE INVENTION

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention, including what is presently believed to be the best modes of carrying out the invention.

In this regard, the invention is illustrated in the several figures, and is of sufficient complexity that the many parts, interrelationships, and sub-combinations thereof simply cannot be fully illustrated in a single patent-type drawing. For clarity and conciseness, several of the drawings show in schematic, or omit, parts that are not essential in that drawing to a description of a particular feature, aspect or principle of the invention being disclosed. Thus, the best mode embodiment of one feature may be shown in one drawing, and the best mode of another feature will be called out in another drawing.

All publications, patents and applications cited in this specification are herein incorporated by reference as if each individual publication, patent or application had been expressly stated to be incorporated by reference.

Figure 1:
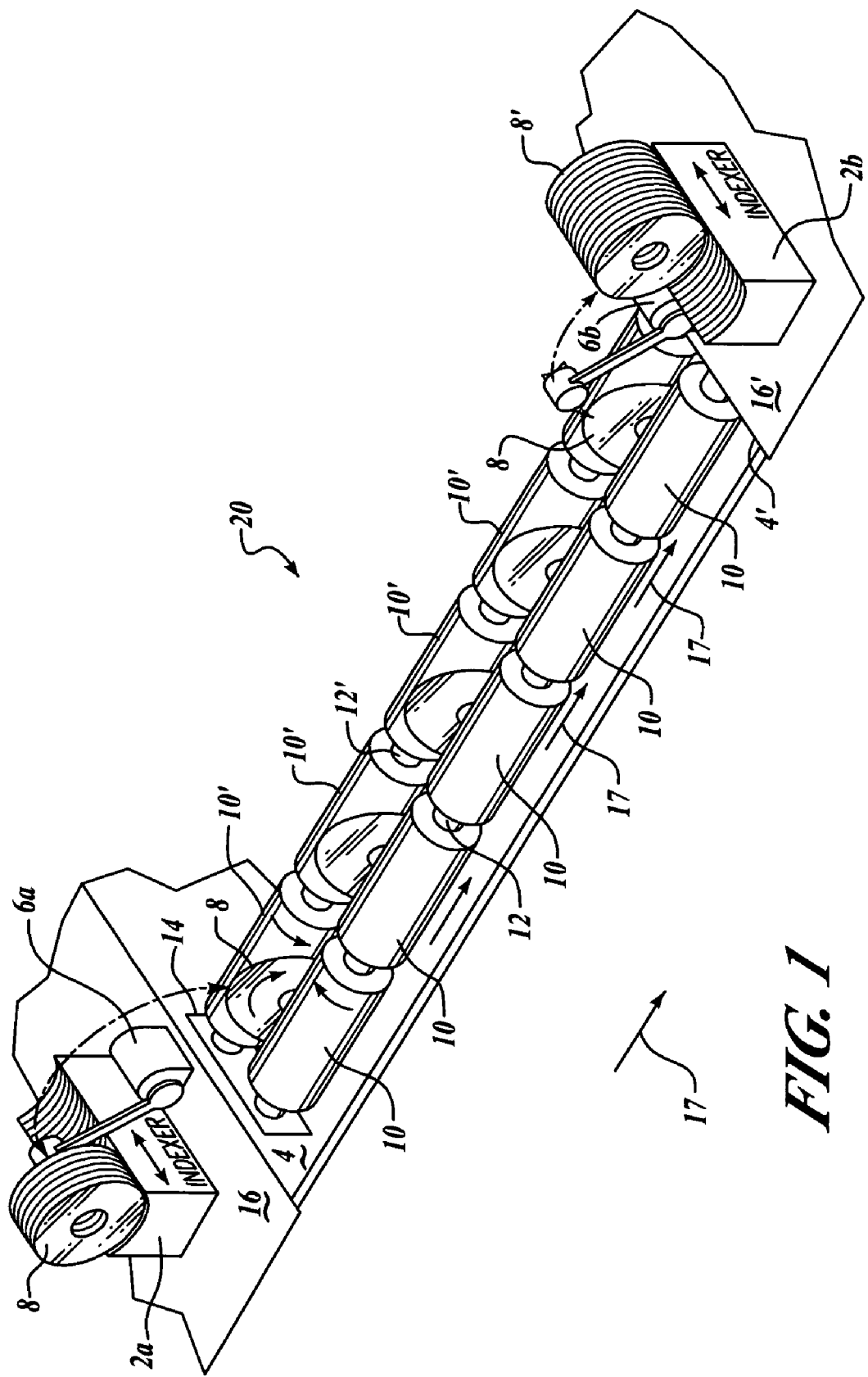
FIG. 1 shows for context of the inventive seal system, an isometric, partially schematic, view of a cascade-type disk scrubber employing paired cylindrical scrubber rollers mounted on spaced horizontal mandrels, the fluid delivery end of which carries the improved fluid delivery system of this invention.

FIG. 1 shows the context of the inventive cascade scrubber irrigation seal assembly. Cascade-scrubber assembly 20 is generally situated between an input cassette 2a that has indexing capability for a robotic pick-and-place handler 6a for placing the disks 8 to be cleaned one after the other between the nips of the spaced scrubbing rollers 10, 10' that counter rotate on the mandrels 12, 12'. A disk transport mechanism beneath the scrubber rollers (not shown) carries the disks through a progression of roller stations, defined by the gaps between roller segments, in the direction 17, left to right in this figure, to a second pick-and-place robot handler 6b that removes the now-cleaned disks 8' and places them in an indexable discharge cassette 2b. As shown, the pick-and-place robot is handling hard drive disk substrates, but it should be understood that the cascade scrubber can clean silicon wafers with suitable vacuum picker or edge picker type robotic arm assemblies.

The inventive irrigation seal assembly is located in a mandrel housing assembly 14 inset into one or more of the end walls 4, 4' of the scrubber housing base 16, 16'. In the preferred embodiment, only one end of the mandrel has a scrubbing/rinsing fluid inlet which requires a seal assembly. The opposite end is slideably splined into a drive that counter rotates the paired mandrels at a controlled rate suitable for the cleaning/rinsing cycle of a particular substrate.

The mandrel has a central fluid feed bore on the order of half to the full length that carries the scrubber brushes, but no further, so that all the fluid under pressure is forced out the fine holes in the cores carrying the brushes. Stated in another way, the mandrel axial bores are dead-ended, the fluid exit being through the brushes from inside to the outer surface that contacts the substrates being cleaned. It is preferred that the central axial cleaning fluid feed bore of the mandrel extends only half way along that length, and there communicates with a series of radial bores that in turn provide a fluid path to groves along the exterior surface of the mandrel spanning the full length covered by the scrub brush cores. Thus, the cleaning fluid enters one end of the mandrel, proceeds under pressure to the longitudinal center, is distributed radially to a series of longitudinal grooves forming a distribution manifold both forward and back of the radial bores (both left and right in FIG. 1). These external grove manifolds on the mandrel in turn provide substantially equal quantities of fluid flow per unit time under equal pressure to each of the scrub brushes.

It should also be understood that the fluid input need not be at the substrate input end of the cascade scrubber assembly. That is the fluid flow may be counter flow the direction of travel of the substrates. In FIG. 1, the cleaning fluid flow through the mandrel bore could be either co-directional, that is, left to right, or counter flow, that is, right to left. Further, while the inventive irrigation seal assembly will be described with respect to a single mandrel, it should be understood that the mandrel housing assembly 14 houses a pair of the inventive sliding seal assemblies, one for each of the paired, spaced mandrels. In addition, it should be clear that each mandrel can be fed the same or different cleaning/rinsing fluid compositions. While the preferred is deionized water (DI water), a wide range of cleaning compositions may be used. Different cleaning compositions may be employed where the opposite faces of a given substrate are different and/or there are different cleaning regimens required.

Figure 2:
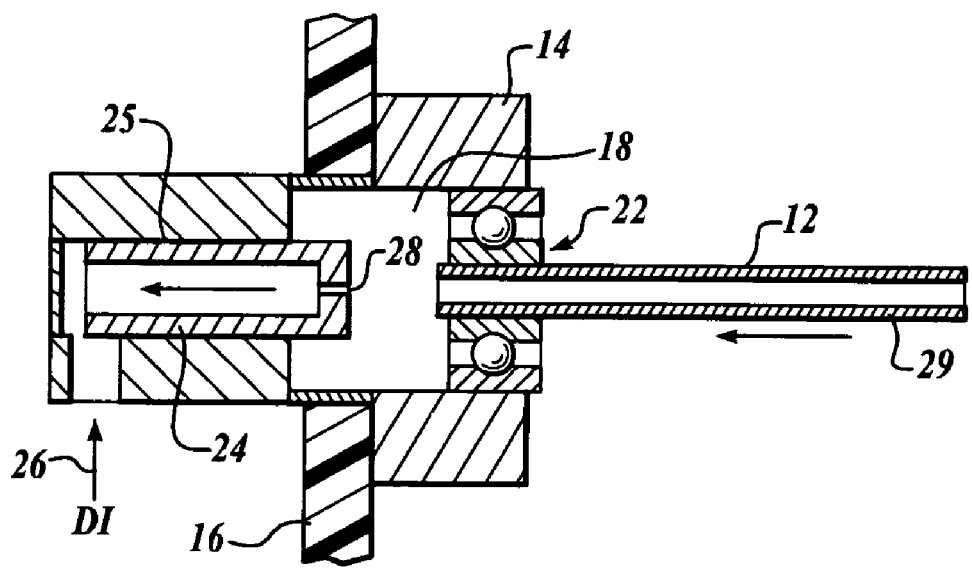
FIG. 2 shows, in schematic cross section, a mandrel and fluid delivery system of the commercially available type that is typically employed in a cascade scrubber of FIG. 1, the piston being in the retracted position to permit removal of the mandrel to service the brushes mounted thereon.
Figure 3:
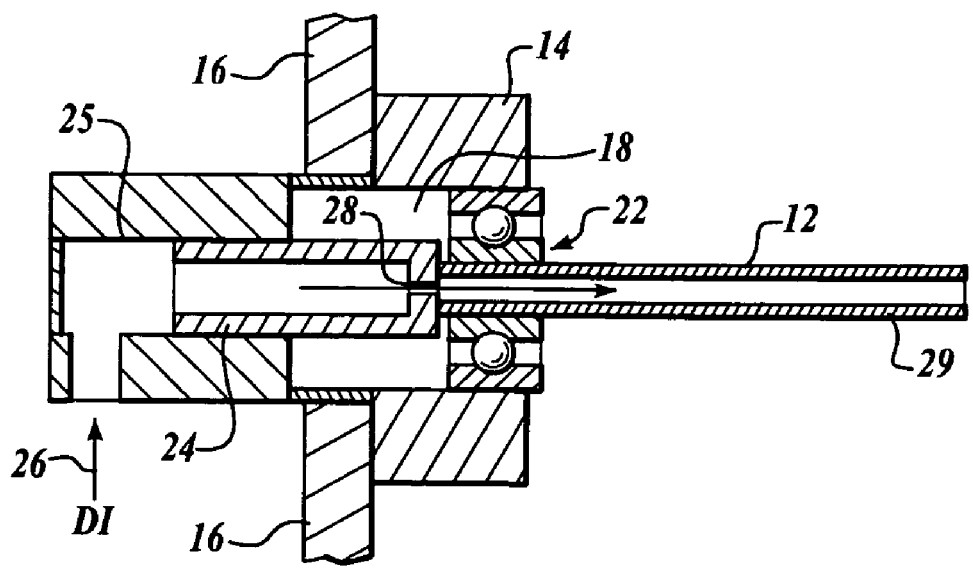
FIG. 3 shows, in schematic cross section, the mandrel and fluid delivery system of the prior art of FIG. 2 with the piston in its operating position moved to the right into contact with the mandrel, and identifying the contact area where wear produces debris particulates.

Turning now to FIGS. 2 and 3, the currently available commercial mandrel idler housings are shown as providing DI water to the mandrel center bore for inside out irrigation of PVA brushes. In FIG. 2, the slideable piston/nozzle is slid to the left to permit the mandrel to be removed. When the piston slides to the left, the mandrel can also be slid to the left, and the splines at the opposite end disengaged from the mandrel drive (not shown). FIG. 3 shows the piston in its deployed position, slid to the right into contact with the end of the mandrel during the cleaning operation.

In FIGS. 2 and 3, the idler housing 14 is received in the sump wall 16 and includes a pair of spaced bores 18 (one is shown) to receive the idler bearing 22 in which the mandrel 12 is secured. A slideable piston 24 is axially aligned in piston bore 25 which communicates to a cleaning/rinsing fluid supply 26 via a radial supply bore. The closed tip of the piston includes a nozzle aperture 28 that feeds the cleaning/rinsing fluid to the hollow manifold bore 29 of the mandrel 12. In FIG. 2 the piston is retracted back into the housing so the mandrel can be slid to the left for disengagement from the drive splines at the opposite end (not shown). In FIG. 3, the piston is deployed to the right in the operating position for delivery of fluid to the mandrel bore 29, and the contact area is where the wear occurs by the fluid pressure thrust of the fluid on the piston, resulting in wear particulates being transported into the mandrel bore and thence out to the brush/substrate interface where they contribute to contamination.

Figure 4:
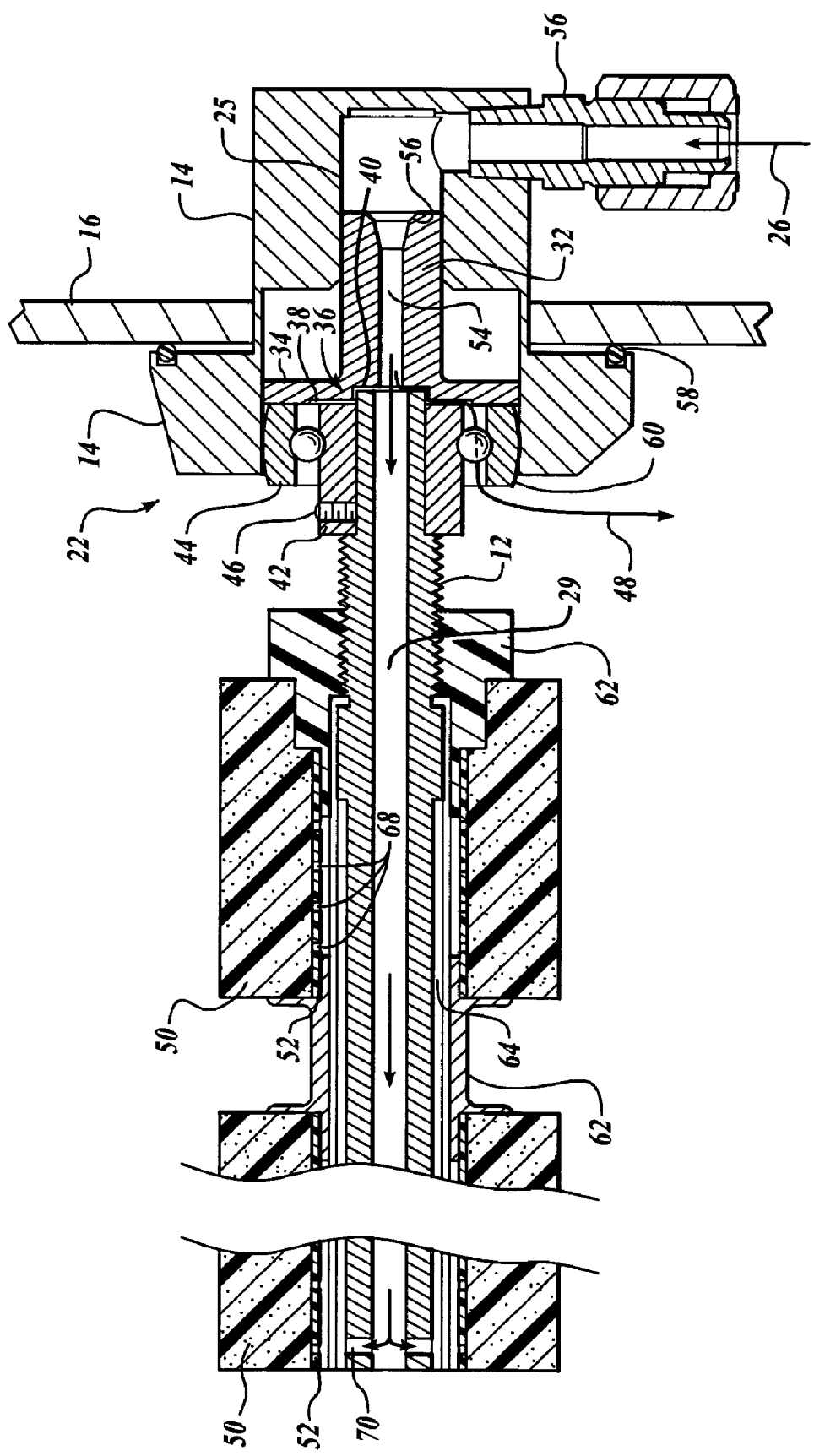
FIG. 4 shows in cross-section the fluid delivery and seal system of this invention in the operational position and features of no mandrel contact, controlled leakage and improved piston design.
Figure 5:
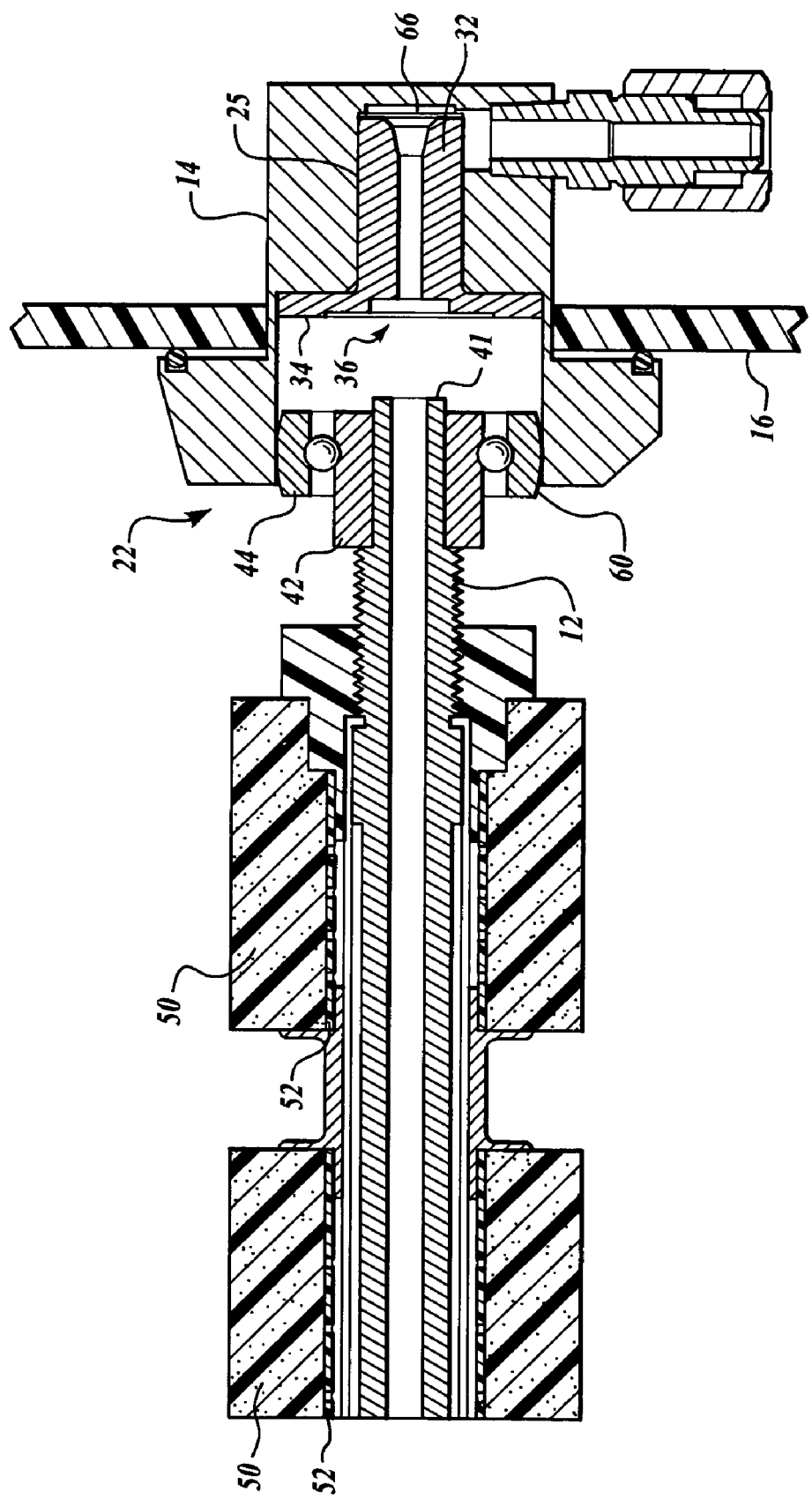
FIG. 5 shows in cross-section the fluid delivery and seal system of this invention with the piston in the retracted position to permit the mandrel and brushes assembly removal for servicing.

FIGS. 4 and 5 illustrate the inventive irrigation seal assembly, with FIG. 3 showing the operating position of the piston 32 and FIG. 5 showing the retracted position for removal of the mandrel. Note that the piston 32 of the inventive irrigation seal assembly has an external forward flange 34 that extends out to the bearing bore 18 of the housing 14. The outer face of the flange includes a stepped recess configuration 36 that includes a recess 38 to provide a clearance gap between it and the rotating inner race 42 while the fluid pressure is taken by contact of the outer margin 34 of the flange with the stationary outer race 44 of the idler bearing assembly 22. The flange also includes a second recess 40 to provide clearance between the piston 32 and the inner end 41 of the mandrel 12.

While it should be clear that a single deep recess can extend outwardly to provide the clearance with the inner race, two key functionalities of the recessed flange configuration is that all the pressure is taken by the outer margin of the flange 34 against the stationary race 44. Thus there is no rotational wear as both the piston and the outer race are stationary. The rotating parts are the mandrel 12 and the inner race 42, and they contact nothing. Note the inner race 42 is secured to the mandrel by set screw 46.

The second functionality point in regards to the recessed flange is that the fine gap between the recess 40 and the end 41 of the mandrel 12 permits a slow, tolerance controlled leakage of fluid out the recess(es) between the bearings and out into the housing sump as shown by arrow 48. This provides a second level of prevention of scrubber brush/substrate interface contamination in that the leak continuously flushes to the exterior any possible wear particulates that might occur at the piston/mandrel interface. Note the mandrel 12 is shown in FIGS. 4 and 5 having cleaning fluid distribution grooves 64 in communication with the central bore 29, via radial port 70 and one or more PVA brushes 50 mounted on core 52. The brush segments may be spaced apart by spacers 62. The cores include apertures 68 to provide the inside-out irrigation of the brushes as shown by the fluid flow arrows.

In addition, note that the bore 54 of the piston 32 has no nozzle such that there is no axial pressure directly opposed to the mandrel as in the design of prior art piston/nozzle units in FIGS. 2 and 3. Rather, the inventive piston includes a chamfered entry 56 so that the pressure bears longitudinally on the walls of the piston, and thence to the flange. Thus the force from the fluid pressure is smoothly transferred out the margin of the flange 34 and thence to the stationary race 44. The cleaning fluid is provided through union 56. The idler housing is sealed to the plastic or stainless steel sump wall 16 by means of an O-ring seal 58.

In FIG. 5 the flanged nozzle-less piston 32 is shown retracted to the right for the removal of the mandrel. Note the outer surface 60 of the outer race 44 is concave to facilitate the mandrel removal, that is, it can be tilted to assist removal as needed. Note also that there is a recess 66 at the bottom of the piston bore 25 to provide a gap for fluid pressure movement of the piston back to the left (FIG. 4).

INDUSTRIAL APPLICABILITY

It is clear that the inventive fluid delivery and seal assembly of this application has wide applicability to the disk cleaning industry, namely to brush scrubber systems using fluid cleaning and rinsing for the preparation of semiconductor wafers and of substrates for HDDs, CDs, DVDs and the like. The system clearly reduces the possibility of contributing particulate debris in the scrubbing and rinsing process steps by eliminating direct contact between the delivery piston and the bearing journaled on the scrubber brush mandrel through provision of a tolerance-controlled leak path, and selection of materials that do not provide metallic debris. Thus, the inventive system keeps ahead of the particulates cleanliness standards, and has the clear potential of becoming adopted as the new standard for methods of scrubber brush fluid delivery sealing in disk substrate scrubbing systems.

It should be understood that various modifications within the scope of this invention can be made by one of ordinary skill in the art without departing from the spirit thereof and without undue experimentation. For example, the flange and recess configuration of the sliding piston can have a wide range of designs to provide the functionalities disclosed herein. Likewise the fluid inlet port may be coaxial with the piston bore rather than radial to it. This invention is therefore to be defined by the scope of the appended claims as broadly as the prior art will permit, and in view of the specification if need be, including a full range of current and future equivalents thereof.

The invention claimed is:

1. An improved irrigation seal assembly for a cascade-type substrate scrubber comprising in operative combination:
    a) an idler bearing housing including sequential stepped bores, a first large bore for receiving an idler bearing and a smaller bore for receiving a piston, and a cleaning/rinsing fluid input port;
    b) a slideable piston having a cylindrical body sized for sliding fit in said piston bore, and a disk-shaped flange at one end sized to fit in said idler bearing bore;
        i) said piston having a central bore; and
        ii) said flange having at least one recess in the outer face;
    c) an idler bearing having an inner, rotatable race into which a brush mandrel is securable, and an outer, stationary race that is received in said idler bearing bore of said housing;
    d) a mandrel securable in said bearing inner race for retaining cleaning brushes, having a central bore for fluid conduit to irrigate said brushes from the inside out;
    e) said flange recess is positioned coordinate with the end of said mandrel to provide a controlled tolerance gap between the outer face of said flange and the end of said mandrel, said piston central bore is substantially equal to the bore of said mandrel bore, and said flange marginal edge contacts the outer stationary race of said idler bearing so that pressure on said piston bears only on said outer race; and
    f) said housing piston bore is axially longer than said piston to permit said piston to slide from an operating position adjacent the end of said mandrel to a retracted position to permit removal of said mandrel.

2. Improved irrigation seal assembly as in claim 1 wherein said flange recess provides clearance between said flange and said idler bearing inner race so that the tolerance gap provides a controlled leak of cleaning fluid from said piston bore out said bearing to divert wear particulates away from said mandrel fluid conduit bore.

3. Improved irrigation seal assembly as in claim 2 wherein said idler bearing outer race surface is concave to permit angular motion of said mandrel when removing said mandrel from said housing idler bearing bore.

4. Improved irrigation seal assembly as in claim 2 wherein said piston bore includes a recess at its bottom to permit fluid pressure to cause said piston to move into said operating position from said retracted position.

5. Improved irrigation seal assembly as in claim 4 wherein said housing input port includes a radial bore communicating with said piston bore.

6. Improved irrigation seal assembly as in claim 5 wherein said piston end opposite said flange is chamfered to said piston bore.

7. Improved irrigation seal assembly as in claim 2 wherein said flange recess is stepped.

8. Improved irrigation seal assembly as in claim 2 wherein said housing includes a seal member for sealing said housing in a scrubber assembly sump.

\* \* \* \* \*